United States Patent
Fan et al.

(10) Patent No.: US 10,015,439 B1
(45) Date of Patent: Jul. 3, 2018

(54) SYSTEM FOR FREQUENCY MODULATION OF HIGH DEFINITION COMPOSITE VIDEO BROADCAST SIGNALS IN A WIRELESS TRANSMISSION ENVIRONMENT AND METHOD THEREOF

(71) Applicant: Scientronic Inc., Taipei (TW)

(72) Inventors: Cheng-Ta Fan, Taipei (TW);
Shiang-Joe Lee, Taipei (TW)

(73) Assignee: Scientronic Inc., Taipei (TW)

(*) Notice: Subject to any disclaimer, the term of this patent is extended or adjusted under 35 U.S.C. 154(b) by 0 days.

(21) Appl. No.: 15/831,516

(22) Filed: Dec. 5, 2017

(30) Foreign Application Priority Data

Jul. 25, 2017 (TW) .............................. 106124902 A

(51) Int. Cl.
| | |
|---|---|
| *H04N 5/38* | (2006.01) |
| *H04N 5/40* | (2006.01) |
| *H04N 5/44* | (2011.01) |
| *H04N 5/455* | (2006.01) |
| *H04N 7/01* | (2006.01) |
| *H04N 7/045* | (2006.01) |
| *H04L 27/00* | (2006.01) |
| *H04L 27/14* | (2006.01) |
| *H04L 27/12* | (2006.01) |
| *H04H 20/71* | (2008.01) |
| *H03F 1/26* | (2006.01) |

(52) U.S. Cl.
CPC ....... *H04N 7/0125* (2013.01); *H04L 27/0002* (2013.01); *H04L 27/12* (2013.01); *H04L 27/14* (2013.01); *H04N 7/045* (2013.01); *H03F 1/26* (2013.01); *H04H 20/71* (2013.01); *H04H 2201/183* (2013.01)

(58) Field of Classification Search
CPC .... H04N 7/0125; H04N 7/045; H04N 5/4401; H04N 5/4403; H04N 5/455; H04N 5/38; H04N 5/40; H04L 27/0002; H04L 27/12; H04L 27/14; H03F 1/26; H04H 20/71; H04H 2201/183
USPC ......... 348/723–726, 469, 470, 441; 375/295, 375/316; 725/67, 68, 98, 100, 118, 131, 725/139, 148, 151
IPC ................... H04N 5/455,5/44, 5/38, 5/39, 7/01, H04N 7/04
See application file for complete search history.

(56) References Cited

U.S. PATENT DOCUMENTS

| | | | | |
|---|---|---|---|---|
| 2003/0161411 | A1* | 8/2003 | McCorkle | H04L 27/0004 375/295 |
| 2012/0257694 | A1* | 10/2012 | Balakrishnan | H04H 40/72 375/340 |
| 2013/0195151 | A1* | 8/2013 | Miller | H04B 1/006 375/219 |

* cited by examiner

*Primary Examiner* — Sherrie Hsia
(74) *Attorney, Agent, or Firm* — Alan D. Kamrath; Kamrath IP Lawfirm, P.A.

(57) ABSTRACT

The present invention provides a system for frequency modulation of high definition composite video broadcast signals in a wireless transmission environment and a method thereof, comprising: a transmitting unit and a receiving unit. An image sensor of the transmitting unit converts an image to a digital signal. A signal processor converts the digital signal to a composite video broadcast signal. A frequency modulator modulates the composite video broadcast signal to a first modulated signal. The receiving unit receives the first modulated signal. A low noise amplifier converts the first modulated signal to a second modulated signal. A frequency demodulator restores the second modulated signal to the composite video broadcast signal. After an image decoder decodes the composite video broadcast signal, the image decoder outputs a digital signal in a specific format.

22 Claims, 2 Drawing Sheets

SYSTEM FOR FREQUENCY MODULATION OF HIGH DEFINITION COMPOSITE VIDEO BROADCAST SIGNALS IN A WIRELESS TRANSMISSION ENVIRONMENT AND METHOD THEREOF

BACKGROUND OF THE INVENTION

Field of the Invention

The present invention relates to the technical field of image processing, particularly to a system for frequency modulation of high definition composite video broadcast signals in a wireless transmission environment and a method thereof.

Description of the Related Art

Currently, the composite video broadcast signal (CVBS) can only transmit standard definition (such as 640×480) video in a wireless transmission environment owing to the limitations of the existing NTSC specification.

Further, to achieve a real time video signal by means of wireless transmission in the wireless transmission environment (for example, in the field of aerial drone first person view video), only the standard definition composite video signal or the high definition digital video signal can be used. However, for the high definition digital video transmission, both the transmitting unit and the receiving unit are subject to digital image compression/decompression so the signal can be effectively transmitted in the bandwidth limited wireless transmission environment. This approach will introduce sizable latencies to the video transmission, which is in contradiction to the requirement of real-time video in the wireless transmission environment. Also, despite introducing very little latency to the video transmission, the use of the standard definition composite video signal in the wireless transmission environment cannot meet the requirement of high definition video.

Therefore, the method of transmitting low latency high definition video in the wireless transmission environment disclosed in the prior art still needs improvements.

SUMMARY OF THE INVENTION

An objective of the present invention is to provide a system for frequency modulation of a composite video broadcast signal, comprising: a transmitting unit that includes an image sensor for converting a sensed image into a digital signal, a signal processor for converting the digital signal into a composite video broadcast signal, and a frequency modulator for modulating the composite video broadcast signal to a first modulated signal; and a receiving unit that receives the first modulated signal and includes a low noise amplifier for amplifying the first modulated signal to a second modulated signal with amplitude uniformity, a frequency demodulator for restoring the second modulated signal to the composite video broadcast signal; and an image decoder for decoding the demodulated composite video broadcast signal to output a digital signal in a specific format. Another objective of the present invention is to provide a method of modulating composite video broadcast signals, including the steps of converting an image sensed by an image sensor into a digital signal through the image sensor of the transmitting unit; converting the digital signal into the composite video broadcast signal through the signal processor of the transmitting unit; modulating the composite video broadcast signal to a first modulated signal through the frequency modulator of the transmitting unit and then transmitting the first modulated signal via an antenna; receiving the first modulated signal via an antenna in the receiving unit; amplifying the first modulated signal to the second modulated signal with amplitude uniformity through the low noise amplifier of the receiving unit; restoring the second modulated signal to the composite video broadcast signal through the frequency demodulator of the receiving unit; and decoding the restored composite video broadcast signal to output a digital signal in a specific format through the image decoder of the receiving unit.

Through the system for frequency modulation of a high definition composite video broadcast signal and the method thereof in the present invention, the high definition composite video broadcast signal can be transmitted in the wireless transmission environment by frequency modulation (FM) without the need for digital compression/decompression required by the wireless transmission of high definition digital video in the prior art. Therefore, it is possible to obtain a real time high definition analog video signal with very little latency, and to omit the relevant compression/decompression hardware, and thus to have the benefits of power saving and low cost at the same time.

DETAILED DESCRIPTION OF THE PREFERRED EMBODIMENT

Hereafter, the other advantages and effects of the present invention will be better understood by those skilled in the art with reference to preferred embodiments and the present invention can be performed with other various embodiments by people skilled in the art.

Figure 1:
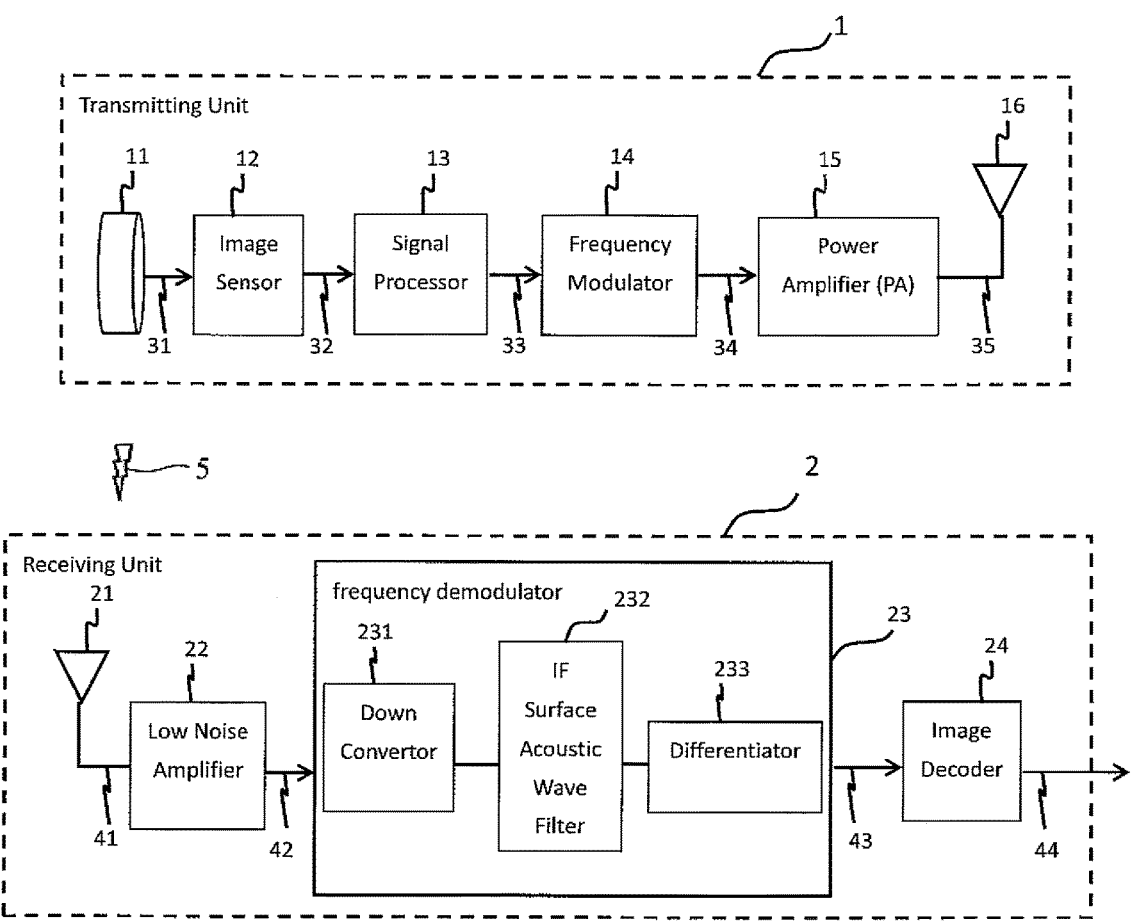
FIG. 1 is a block diagram showing a system for frequency modulation of a high definition composite video broadcast signal in the present invention.

Please refer to FIG. 1. A system for frequency modulation of a high definition composite video broadcast signal in the present invention can include a transmitting unit 1 and a receiving unit 2. The transmitting unit 1 includes a lens 11, an image sensor 12, a signal processor 13, a frequency modulator 14, a power amplifier 15, and an antenna 16. The receiving unit 2 includes an antenna 21, a low noise amplifier 22, a frequency demodulator 23, and an image decoder 24.

The image sensor 12 is used to convert a sensed image into a digital signal 32. Specifically, the front of the image sensor 12 is provided with a lens 11 which can focus light such that the focused light 31 falls on the image sensor 12 and the image sensor 12 can sense and generate an image. In an embodiment, the lens 11 can be replaced as needed.

The image sensor 12 is a photoelectric element, such as a CMOS (Complementary Metal-Oxide-Semiconductor) sensor, which can convert the light 31 into the digital signal 32. In an embodiment, the image sensor 12 converts the sensed image into a high definition digital image signal with a resolution of 1280×720, 1280×960, 1920×1080, or 3840×2160, etc.

The signal processor 13 receives the digital signal 32 and converts it into a composite video broadcast signal 33. Specifically, the signal processor 13 first separates the digital signal 32 into a luminance signal and a chrominance signal. The luminance signal is filtered with the first specific frequency and the chrominance signal is demodulated with the second specific frequency. The filtered luminance signal and the demodulated chrominance signal are encoded as the composite video broadcast signal 33, which may be a high definition composite video analog signal with a resolution of 1280×720, 1280×960, 1920×1080, or 3840×2160.

In an embodiment, the first specific frequency is 9.7 MHz and the second specific frequency is 11.475 MHz. Also, in an embodiment, the first specific frequency is 21.8 MHz and the second specific frequency is 24 MHz, but the present invention is not limited thereto.

The frequency modulator 14 receives the composite video broadcast signal 33 and modulates it to a first modulated signal 34. Specifically, the frequency modulator 14 modulates the composite video broadcast signal 33 to the first modulated signal 34 in the Industrial Scientific Medical (ISM) band with a bandwidth of 28 MHz to 108 MHz in the manner of frequency modulation (FM), wherein the ISM band is 5.8 GHz or 2.4 GHz. For the first modulated signal 34 to be transmitted further, the first modulated signal 34 can be sent to the power amplifier 15 to amplify its amplitude. After that, the amplified first modulated signal 35 can be transmitted via the antenna 16.

The transmitting unit 1 sends data to the receiving unit 2 through radio waves 5. The receiving unit 2 can receive the amplified first modulated signal 35 transmitted by the antenna 16 of the transmitting unit 1 (e.g., wireless transmission environment) via the antenna 21. That is, the antenna 21 can collect radio waves in the ISM band (5.8 GHz or 2.4 GHz). Since the collected radio wave amplitude is small and the signal is weak, the antenna 21 of the receiving unit 2 can transmit the amplified first modulated signal 41 to the low noise amplifier 22 to amplify the amplified first modulated signal 41 to the second modulated signal 42 with amplitude uniformity, and then send the second modulated signal 42 to the frequency demodulator 23.

The frequency demodulator 23 is used to restore the second modulated signal 42 to a composite video broadcast signal 43. Specifically, the frequency demodulator 23 includes a down convertor 231, an IF surface acoustic wave filter 232, and a differentiator 233. The second modulated signal 42 is first sent to the down convertor 231, and the down convertor 231 down converts the second modulated signal 42 to an IF signal having a frequency of 480 MHz. Then the IF signal is sent to an IF surface acoustic wave filter 232 for wave filtering. In an embodiment, the IF surface acoustic wave filter 232 is a band-pass filter with a center frequency of 480 MHz and a bandwidth of 28 MHz to 108 MHz. The filtering of the IF surface acoustic wave filter 232 is performed to reduce noise interference so that the subsequent demodulation of the composite video broadcast signal 43 has relatively little noise. After the IF signal is filtered with the IF surface acoustic wave filter 232, it is sent to the differentiator 233 to be restored to the composite video broadcast signal 43 and then sent to the image decoder 24. The composite video broadcast signal 43 may be a high definition composite video analog signal with a resolution of 1280×720, 1280×960, 1920×1080, or 3840×2160.

The image decoder 24 decodes the restored composite video broadcast signal 43 to output a digital signal 44 in a specific format. In an embodiment, during decoding, the image decoder 24 can adjust the brightness and saturation of the image and then output a digital signal 44 in a specific format. In an embodiment, the specific format is BT 656, BT 1120, HDMI, or Display Port format, but the present invention is not limited thereto.

Finally, the user can connect to the corresponding monitoring device according to the output of the digital signal in a specific format to see the high definition video in real time.

Figure 2:
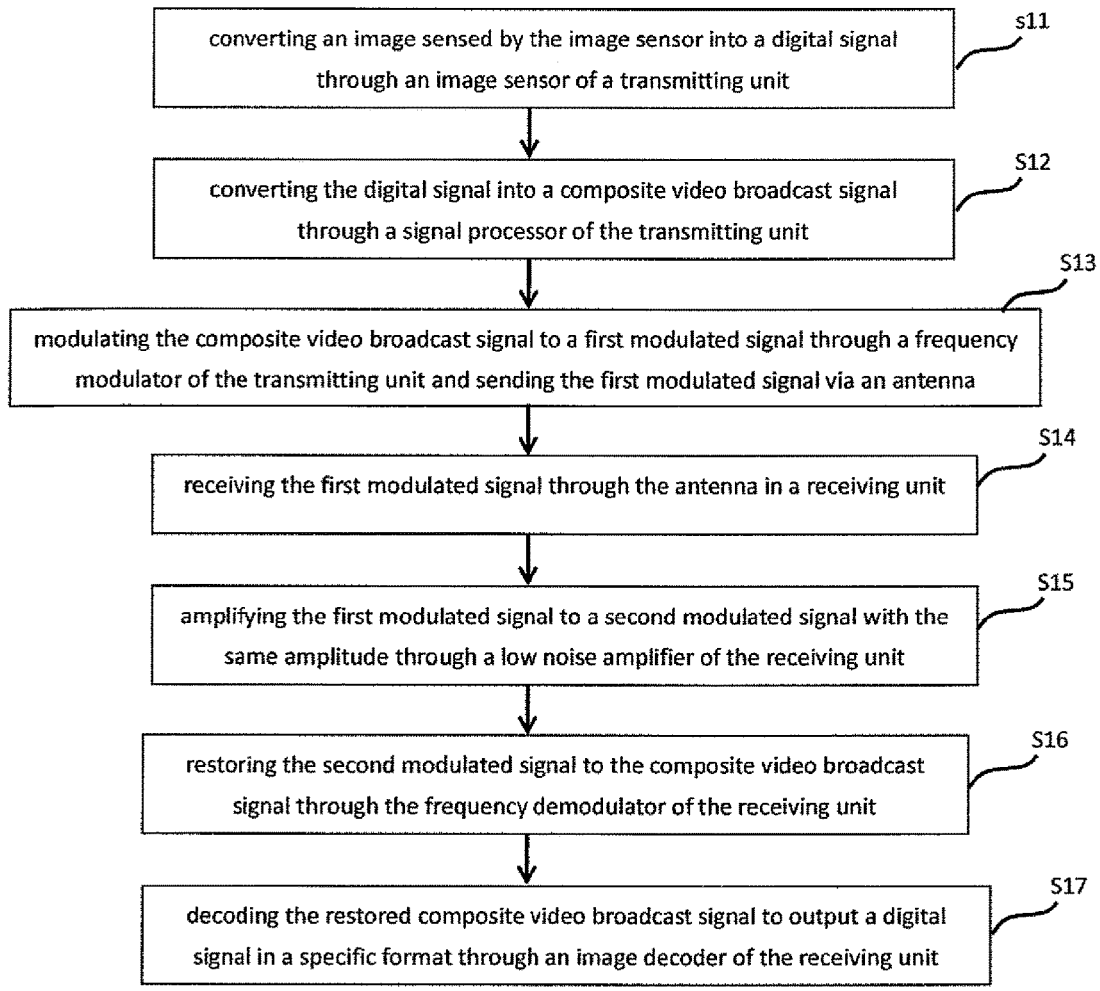
FIG. 2 is a flowchart showing steps in a method of frequency modulation of a high definition composite video broadcast signal according to the present invention.

Please refer to FIG. 2, a method of frequency modulation of high definition composite video broadcast signals in the present invention is applicable to the aforementioned system for frequency modulation of a high definition composite video broadcast signal, and the same technical contents will not be described in detail hereafter. The steps in the method of the present invention are as follows: in Step S11, converting the image sensed by an image sensor into a digital signal through the image sensor in the transmitting unit, and then proceeding to Step S12; in Step S12, converting the digital signal into a composite video broadcast signal through a signal processor in the transmitting unit, and then proceeding to Step S13; in Step S13, modulating the composite video broadcast signal to a first modulated signal, which is performed by a frequency modulator of the transmitting unit, then sending the first modulated signal by an antenna, and then proceeding to Step S14; in Step S14, receiving the first modulated signal through an antenna in the receiving unit, and then proceeding to Step S15; in Step S15, amplifying the first modulated signal to a second modulated signal with amplitude uniformity through a low noise amplifier of the receiving unit, and then proceeding to Step S16; in Step S16, restoring the second modulated signal to the composite video broadcast signal through a frequency demodulator of the receiving unit, and then proceeding to Step S17; in Step S17, decoding the restored the composite video broadcast signal to output a digital signal in a specific format through an image decoder of the receiving unit.

In an embodiment, in Step S1, the image sensor converts the sensed image into a high definition digital image signal with a resolution of 1280×720, 1280×960, 1920×1080, or 3840×2160.

In an embodiment, in Step S12, the digital signal is first divided into a luminance signal and a chrominance signal by the signal processor, wherein the luminance signal is filtered with the first specific frequency and the chrominance signal is modulated with the second specific frequency, and the filtered luminance signal and the modulated chrominance signal are together encoded into the composite video broadcast signal. Specifically, the first specific frequency is 9.7 MHz and the second specific frequency is 11.475 MHz, or the first specific frequency is 21.8 MHz and the second specific frequency is 24 MHz.

In an embodiment, in Step S13, the first modulated signal modulated by the frequency modulator is in the ISM band and the bandwidth is between 28 MHz and 108 MHz. Also, the frequency modulator first converts the composite video broadcast signal into the first modulated signal, amplifies the amplitude of the first modulated signal through a power amplifier, and then transmits it via an antenna.

In an embodiment, in Step S14, the antenna in the receiving unit is used to receive the first modulated signal in the ISM band.

Additionally, in an embodiment, the Step S16 further includes the following step: down converting the second modulated signal to an IF signal with a frequency of 480 MHz through a down convertor, filtering the IF signal through an IF surface acoustic wave filter, and restoring the filtered IF signal to the composite video broadcast signal through a differentiator. Specifically, the IF surface acoustic wave filter is a band-pass filter with a center frequency of 480 MHz and a bandwidth of 28 MHz to 108 MHz.

In an embodiment, the specific format output by the image decoder in Step S17 is BT 656, BT 1120, HDMI or Display Port format.

Through the system for frequency modulation of a high definition composite video broadcast signal and the method thereof in the present invention, the high definition composite video broadcast signal can be transmitted in the wireless transmission environment in the manner of frequency modulation (FM) without the need for the digital compression/decompression function required by wireless transmitting high definition digital video in the prior art, which is also not restricted by the band width and latency limitations of to the existing packet format based wireless transmission methods (such as Wi-Fi). Therefore, it is possible to obtain an analog high definition video signal in real time with no delay (or very little delay), and to omit the relevant compression/decompression hardware components, and thus to have the benefits of power saving, and low cost at the same time.

The described embodiments are only for illustrative and exemplary purposes, and the technical principles, characteristics and effects of the present invention are not intended to limit the scope of the invention. Various changes and modifications may be made to the described embodiments without departing from the scope of the invention as disposed by the appended claims.

What is claimed is:

1. A system for frequency modulation of a high definition composite video broadcast signal in a wireless transmission environment, comprising:
    a transmitting unit, comprising:
        an image sensor, used for converting a sensed image into a digital signal;
        a signal processor, used for converting the digital signal into a composite video broadcast signal; and
        a frequency modulator, used for modulating the composite video broadcast signal to a first modulated signal; and
    a receiving unit, which receives the first modulated signal, the receiving unit comprising:
        a low noise amplifier, used for amplifying the first modulated signal to a second modulated signal with amplitude uniformity;
        a frequency demodulator, used for restoring the second modulated signal to the composite video broadcast signal; and
        an image decoder, used for decoding the restored composite video broadcast signal to output a digital signal in a specific format.

2. The system for frequency modulation of a high definition composite video broadcast signal as claimed in claim 1, wherein the digital signal is first divided into a luminance signal and a chrominance signal by the signal processor, wherein the luminance signal is filtered with the first specific frequency and the chrominance signal is modulated with the second specific frequency, and the filtered luminance signal and the modulated chrominance signal are together encoded into the composite video broadcast signal.

3. The system for frequency modulation of a high definition composite video broadcast signal as claimed in claim 2, wherein the first specific frequency is 9.7 MHz and the second specific frequency is 11.475 MHz.

4. The system for frequency modulation of a high definition composite video broadcast signal as claimed in claim 2, wherein the first specific frequency is 21.8 MHz and the second specific frequency is 24 MHz.

5. The system for frequency modulation of a high definition composite video broadcast signal as claimed in claim 1, wherein the first modulated signal modulated by the frequency modulator is in the ISM band and has a bandwidth of 28 MHz to 108 MHz.

6. The system for frequency modulation of a high definition composite video broadcast signal as claimed in claim 1, wherein the transmitting unit further comprises a power amplifier and an antenna, the power amplifier being used for amplifying the amplitude of the first modulated signal to be transmitted via the antenna.

7. The system for frequency modulation of a high definition composite video broadcast signal as claimed in claim 1, wherein the receiving unit further includes an antenna used for receiving the first modulated signal in the ISM band.

8. The system for frequency modulation of a high definition composite video broadcast signal as claimed in claim 1, wherein the frequency demodulator further comprises a down convertor, an IF surface acoustic wave filter and a differentiator, the down convertor being used to down convert the second modulated signal to an IF signal with a frequency of 480 MHz, the IF surface acoustic wave filter being used to filter the IF signal, and the differentiator being used to restore the filtered IF signal to the composite video broadcast signal.

9. The system for frequency modulation of a high definition composite video broadcast signal as claimed in claim 8, wherein the IF surface acoustic wave filter is a band-pass filter with a center frequency of 480 MHz and a bandwidth of 28 MHz to 108 MHz.

10. The system for frequency modulation of a high definition composite video broadcast signal as claimed in claim 1, wherein the image sensor converts the sensed image into a digital image signal with a resolution of 1280×720, 1280×960, 1920×1080, or 3840×2160.

11. The system for frequency modulation of a high definition composite video broadcast signal as claimed in claim 1, wherein the specific format is BT 656, BT 1120, HDMI, or Display Port format.

12. A method of frequency modulation of a high definition composite video broadcast signal in a wireless transmission environment, comprising the steps of:
    converting an image sensed by the image sensor into a digital signal through an image sensor in the transmitting unit;
    converting the digital signal into, a composite video broadcast signal through a signal processor of the transmitting unit;
    modulating the composite video broadcast signal to a first modulated signal through a frequency modulator of the transmitting unit and then transmitting the first modulated signal via an antenna in the transmitting unit;
    receiving the first modulated signal through the antenna in the receiving unit;
    amplifying the first modulated signal to a second modulated signal with amplitude uniformity through a low noise amplifier of the receiving unit;
    restoring the second modulated signal to the composite video broadcast signal through a frequency demodulator of the receiving unit; and
    decoding the restored composite video broadcast signal to output a digital signal in a specific format through an image decoder of the receiving unit.

13. The method of frequency modulation of a high definition composite video broadcast signal as claimed in claim 12, wherein the digital signal is first divided into a luminance signal and a chrominance signal by the signal processor, the luminance signal is filtered with the first specific frequency and the chrominance signal is modulated with the second specific frequency, and the filtered luminance signal and the modulated chrominance signal are together encoded into the composite video broadcast signal.

14. The method of frequency modulation of a high definition composite video broadcast signal as claimed in claim 13, wherein the first specific frequency is 9.7 MHz and the second specific frequency is 11.475 MHz.

15. The method of frequency modulation of a high definition composite video broadcast signal as claimed in claim 13, wherein the first specific frequency is 21.8 MHz and the second specific frequency is 24 MHz.

16. The method of frequency modulation of a high definition composite video broadcast signal as claimed in claim 12, wherein the first modulated signal modulated by the frequency modulator is in the ISM band and has a bandwidth of 28 MHz to 108 MHz.

17. The method of frequency modulation of a high definition composite video broadcast signal as claimed in claim 12, wherein the frequency modulator first converts the composite video broadcast signal into the first modulated signal, amplifies the amplitude of the first modulated signal through the power amplifier, and then transmits the amplified first modulated signal via the antenna.

18. The method of frequency modulation of a high definition composite video broadcast signal as claimed in claim 12, wherein the antenna in the receiving unit is used to receive the first modulated signal in the ISM band.

19. The method of frequency modulation of a high definition composite video broadcast signal as claimed in claim 12, wherein the step of the frequency demodulator of the receiving unit restoring the second modulated signal to the composite video broadcast signal comprises:
   down converting the second modulated signal to an IF signal with a frequency of 480 MHz through a down convertor,
   filtering the IF signal through an IF surface acoustic wave filter; and restoring the filtered IF signal to the composite video broadcast signal through a differentiator.

20. The method of frequency modulation of a high definition composite video broadcast signal as claimed in claim 19, wherein the IF surface acoustic wave filter is a band-pass filter with a center frequency of 480 MHz and a bandwidth of 28 MHz to 108 MHz.

21. The method of frequency modulation of a high definition composite video broadcast signal as claimed in claim 12, wherein the image sensor converts the sensed image into a digital image signal with a resolution of 1280×720, 1280×960, 1920×1080, or 3840×2160.

22. The method of frequency modulation of a high definition composite video broadcast signal as claimed in claim 12, wherein the specific format is BT 656, BT 1120, HDMI, or Display Port format.

* * * * *